(12) United States Patent
Chang et al.

(10) Patent No.: US 10,096,611 B2
(45) Date of Patent: Oct. 9, 2018

(54) TRAPPING GATE FORMING PROCESS AND FLASH CELL

(71) Applicant: UNITED MICROELECTRONICS CORP., Hsin-Chu (TW)

(72) Inventors: Wen-Chung Chang, Hsinchu (TW); Sung-Bin Lin, Hsinchu (TW); Cherng-En Sun, New Taipei (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 1 day.

(21) Appl. No.: 14/807,882

(22) Filed: Jul. 23, 2015

(65) Prior Publication Data
US 2017/0025422 A1    Jan. 26, 2017

(51) Int. Cl.
*H01L 27/115*    (2017.01)
*H01L 29/792*    (2006.01)
*H01L 27/1157*    (2017.01)
*H01L 29/423*    (2006.01)
*H01L 29/06*    (2006.01)

(52) U.S. Cl.
CPC ...... *H01L 27/1157* (2013.01); *H01L 29/0653* (2013.01); *H01L 29/42344* (2013.01); *H01L 29/792* (2013.01)

(58) Field of Classification Search
None
See application file for complete search history.

(56) References Cited

U.S. PATENT DOCUMENTS

| | | |
|---|---|---|
| 8,222,114 B2 | 7/2012 | Chiu |
| 2009/0152618 A1* | 6/2009 | Matsuo .................. H01L 27/115 257/324 |
| 2010/0117136 A1* | 5/2010 | Yasuda ............... H01L 29/4234 257/321 |
| 2010/0155817 A1* | 6/2010 | Cheng ................ G11C 16/3427 257/324 |
| 2013/0221424 A1* | 8/2013 | Chen ..................... H01L 29/792 257/324 |
| 2015/0060995 A1* | 3/2015 | Sakamoto .......... G11C 16/0466 257/326 |

* cited by examiner

*Primary Examiner* — Daniel Whalen
(74) *Attorney, Agent, or Firm* — Winston Hsu (57) ABSTRACT

A trapping gate forming process includes the following. An oxide/nitride/oxide layer is formed on a substrate. A hard mask is formed to cover the oxide/nitride/oxide layer. The hard mask, the oxide/nitride/oxide layer and the substrate are patterned to form at least a trench in the hard mask, the oxide/nitride/oxide layer along a first direction. An isolation structure is formed in the trench. A first gate is formed across the oxide/nitride/oxide layer along a second direction orthogonal to the first direction. A flash cell formed by said process includes a substrate, a first gate and an oxide/nitride/oxide layer. The substrate contains at least an active area extending along a first direction. The first gate is disposed across the active area along a second direction orthogonal to the first direction, thereby intersecting an overlapping area. The oxide/nitride/oxide layer is disposed in the overlapping area between the first gate and the active area.

19 Claims, 9 Drawing Sheets

TRAPPING GATE FORMING PROCESS AND FLASH CELL

BACKGROUND OF THE INVENTION

1. Field of the Invention

The present invention relates generally to a trapping gate forming process and a flash cell, and more specifically to a trapping gate forming process and a flash cell, which integrates trapping gate forming processes with isolation structure forming processes.

2. Description of the Prior Art

Communication of mass information is a regular part of modern life. Memory devices that access information are essential for managing such information efficiently. Flash memory, with its advantages of low power consumption, high-speed operation, being readable/writable, non-volatile, and requiring no mechanical operations, has been widely applied to personal computers and electronic apparatus, as operations of data writing, reading, and erasing can be performed repeatedly on a non-volatile memory device and the data stored therein will not be lost even when a power supply is turned off.

Flash memory includes a plurality of memory units, wherein each memory unit includes a specially made MOS (Metal-Oxide-Semiconductor) transistor. Each transistor includes a stacked gate having a trapping gate and a control gate fabricated thereon. The control gate is disposed on the trapping gate directly, the trapping gate and the control gate are isolated by a dielectric layer, and the trapping gate and the substrate are isolated by a tunneling oxide (this is known as a stacked gate flash memory). The transistor may have other assisting gates beside the trapping gate and the control gate, and the memory unit may be integrated with transistors of logic units.

SUMMARY OF THE INVENTION

The present invention provides a trapping gate forming process and a flash cell, which defines trapping gates by an isolation structure forming process, thereby trapping gates can only be disposed in an intersecting area of an above control gate and a below active area isolated by the isolation structure, thus reducing lateral charge migration and threshold voltage lose.

The present invention provides a trapping gate forming process including the following steps. An oxide/nitride/oxide layer is formed on a substrate. A hard mask is formed to cover the oxide/nitride/oxide layer. The hard mask, the oxide/nitride/oxide layer and the substrate are patterned to form at least a trench in the hard mask, the oxide/nitride/oxide layer along a first direction. An isolation structure is formed in the trench. A first gate is formed across the oxide/nitride/oxide layer along a second direction orthogonal to the first direction.

The present invention provides a flash cell including a substrate, a first gate and an oxide/nitride/oxide layer. The substrate contains at least an active area extending along a first direction. The first gate is disposed across the active area along a second direction orthogonal to the first direction, thereby intersecting an overlapping area. The oxide/nitride/oxide layer is disposed in the overlapping area between the first gate and the active area.

According to the above, the present invention provides a trapping gate forming process and a flash cell, which forms an oxide/nitride/oxide layer on a substrate, patterns the oxide/nitride/oxide layer and the substrate to form at least an active area and at least a trench beside the active area along a first direction, forms an isolation structure in the trench, therefore the oxide/nitride/oxide layer can being defined on the active area and trimmed with the isolation structure. Thereafter, a first gate along a second direction orthogonal to the first direction can be formed and the oxide/nitride/oxide layer can be patterned at the same time, thus the oxide/nitride/oxide layer being disposed only on an overlapping area between the first gate and the active area. Thereby, the oxide/nitride/oxide layer is trimmed with the first gate as well as the isolation structure. In this way, due to the oxide/nitride/oxide layer only being in the overlapping area between the first gate and the active area, charge migration can be avoided during data retention, and loss of threshold voltage can be reduced. Besides, since the trench for the isolation structure formed therein is defined by patterning the oxide/nitride/oxide layer, the oxide/nitride/oxide layer can be trimmed with the isolation structure without misalignment occurring.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
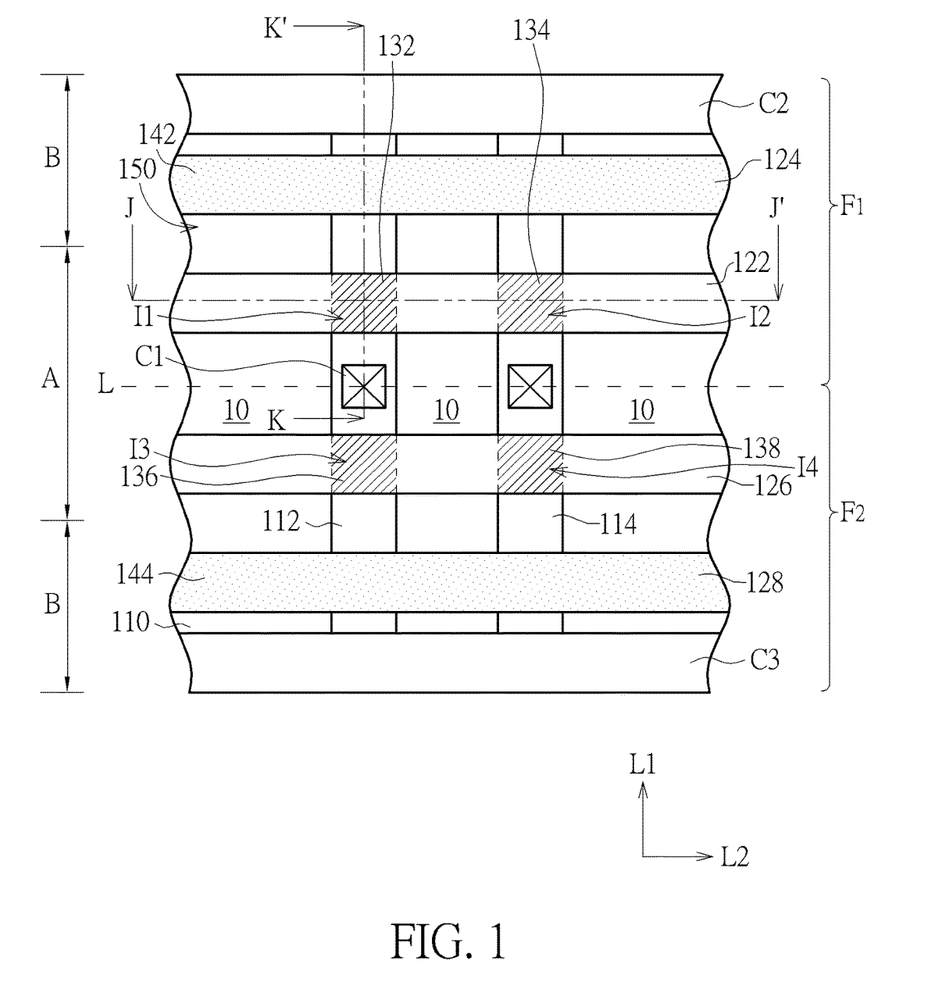
FIG. 1 schematically depicts a top view of flash cells according to an embodiment of the present invention.

FIG. 1 schematically depicts a top view of flash cells according to an embodiment of the present invention. As shown in FIG. 1, a substrate 110 contains two active areas 112/114 extending along a first direction L1. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The two active areas 112/114 are parallel to each other. Two active areas 112/114 are depicted in FIG. 1, but the present invention is not restricted thereto. The substrate 110 should contain at least an active area for transistors formed thereon.

Isolation structures 10 are disposed beside the active areas 112/114. Thus, the isolation structures 10 disposed between the active areas 112/114 can isolate the active areas 112/114 from each other. In this embodiment, the isolation structures 10 are shallow trench isolation structures, which may be formed by a shallow trench isolation process, but it is not limited thereto.

A first gate 122, a second gate 124, a third gate 126 and a fourth gate 128 are disposed across the active areas 112/114 and parallel to each other. That is, the first gate 122, the second gate 124, the third gate 126 and the fourth gate 128 are disposed along a second direction L2. The second direction L2 is orthogonal to the first direction L1. For example, as the first direction L1 is an x-direction, the second direction L2 is a y-direction.

The active areas 112/114 (or the substrate 110) include a flash cell area A and logic areas B beside the flash cell area A. The first gate 122 and the third gate 126 are in the flash cell area A while the second gate 124 and the fourth gate 128 are in the logic areas B. The first gate 122 and the third gate 126 are control gates of flash gates while the second gate 124 and the fourth gate 128 are logic gates. Therefore, the first gate 122 and the second gate 124 constitute a flash cell F1, while the third gate 126 and the fourth gate 128 constitute the other flash cell F2. Contact plugs C1/C2/C3 are disposed at the two corresponding sides of the first gate 122 and the second gate 124 and at the two corresponding sides of the third gate 126 and the fourth gate 128. The flash cell F1 and the flash cell F2 share the common contact plug C1. An interdielectric layer 150 is disposed beside the first gate 122, the second gate 124, the third gate 126 and the fourth gate 128. The interdielectric layer 150 may be oxide, but it is not limited thereto.

On the other aspect, the flash cell F1 is symmetric to the flash cell F2 from a symmetric line L between the third gate 126 and the first gate 122 along the second direction L2. This means the first gate 122 is symmetric to the third gate 126 from the symmetric line L while the second gate 124 is symmetric to the fourth gate 128 from the symmetric line L. Two flash cells are presented in this embodiment for an example, but the number of the flash cells, the structure of the flash cells and layouts of the flash cells are not restricted thereto.

More precisely, the active areas 112/114 and the first gate 122 respectively intersect overlapping areas I1/I2. Oxide/nitride/oxide layers 132/134 serving as trapping gates of the flash gates are disposed in the overlapping areas I1/I2 and between the first gate 122 and the active areas 112/114. The oxide/nitride/oxide layers 132/134 are represented as dash-line in FIG. 1. Preferably, the oxide/nitride/oxide layers 132/134 overlap the whole overlapping areas I1/I2. Likewise, the active areas 112/114 and the third gate 126 respectively intersect overlapping areas I3/I4. Oxide/nitride/oxide layers 136/138 serving as trapping gates of the flash gates are disposed in the overlapping areas I3/I4 and between the third gate 126 and the active areas 112/114. The oxide/nitride/oxide layers 136/138 are represented as dash-line in FIG. 1. Preferably, the oxide/nitride/oxide layers 136/138 overlap the whole overlapping areas I3/I4. It is emphasized that, the oxide/nitride/oxide layers 132/134/136/138 of the present invention are only disposed in the overlapping areas I1/I2/I3/I4, so that the lateral charge migration of the oxide/nitride/oxide layers 132/134/136/138 can be avoided during data retention, and loss of threshold voltage can be reduced.

Gate dielectric layers 142/144 represented as dots are disposed across the active areas 112/114. The gate dielectric layers 142/144 may be oxide or dielectric layers having a high dielectric constant, but it is not limited thereto. The gate dielectric layer 142 is disposed between the second gate 124 and the active areas 112/114. The gate dielectric layer 144 is disposed between the fourth gate 128 and the active areas 112/114. In this embodiment, the gate dielectric layers 142/144 overlap the whole second gate 124 and the whole fourth gate 128, but it is not limited thereto. In another embodiment, the gate dielectric layers 142/144 may only overlap the intersections of the second gate 124 and the active areas 112/114, and the intersections of the fourth gate 128 and the active areas 112/114, depending upon practical requirements.

A method of forming the flash cell F1 and the flash cell F2 including the oxide/nitride/oxide layers 132/134/136/138 of the present invention only disposed in the overlapping areas I1/I2/I3/I4, and the gate dielectric layers 142/144 overlapping the whole second gate 124 and the whole fourth gate 128 is presented in the following, but the present invention is not restricted thereto.

For clarifying the present invention, FIGS. 2-9 schematically depict cross-sectional views of a trapping gate forming process according to an embodiment of FIG. 1 along JJ' line and KK' line, wherein left diagrams of FIGS. 2-9 depict FIG. 1 along JJ' line and right diagrams of FIGS. 2-9 depict FIG. 1 along KK' line. Besides, as the flash cell F1 is symmetric to the flash cell F2, only the flash cell F1 is depicted in FIGS. 2-9 and described as follows. However, the flash cell F2 can be formed in the same way and at the same time as the flash cell F1. Please refer FIGS. 2-9 accompany with FIG. 1.

Figure 2:
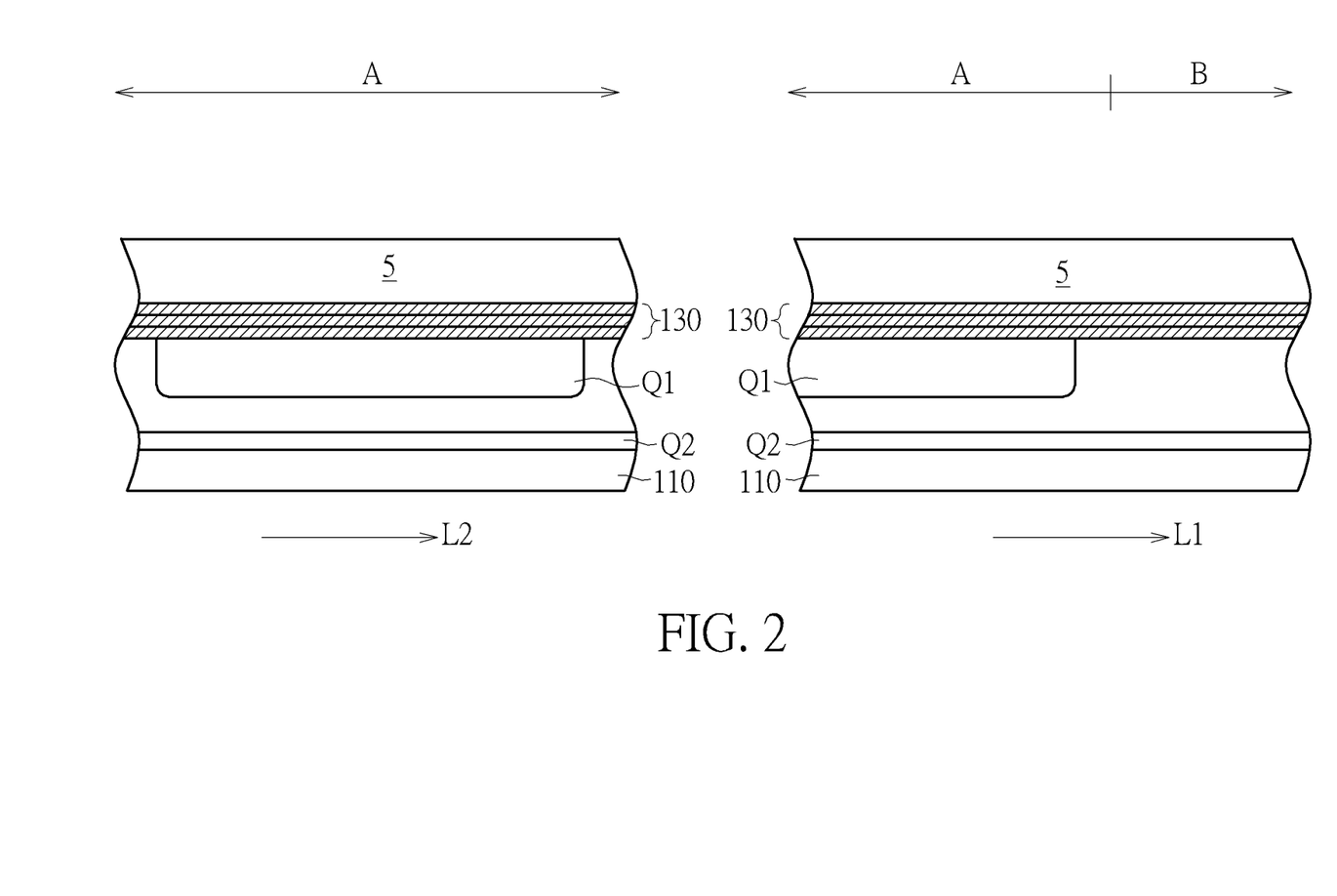
FIGS. 2-9 schematically depict cross-sectional views of a trapping gate forming process according to an embodiment of FIG. 1 along JJ' line and KK' line.

As shown in FIG. 2, a substrate 110 is provided. An oxide/nitride/oxide layer 130 may blanketly cover the substrate 110 of the flash cell area A and the logic area B. Then, a hard mask 5 may blanketly cover the substrate 110 of the flash cell area A and the logic area B. The hard mask 5 may be a nitride layer, an oxide/nitride layer, or an oxide/nitride/oxide layer, but it is not limited thereto. In this embodiment, the hard mask 5 is a single layer, but the hard mask 5 may be a multilayer in another embodiment.

Furthermore, a flash cell implantation region Q1 may be formed in the substrate 110 or/and an embedded implantation region Q2 may be formed in the substrate 110 by methods such as ion implantation processes before the oxide/nitride/oxide layer 130 is formed. As the flash cell implantation region Q1 is a P-type well, the embedded implantation region Q2 may be an N-type well, but it is not limited thereto.

Figure 3:
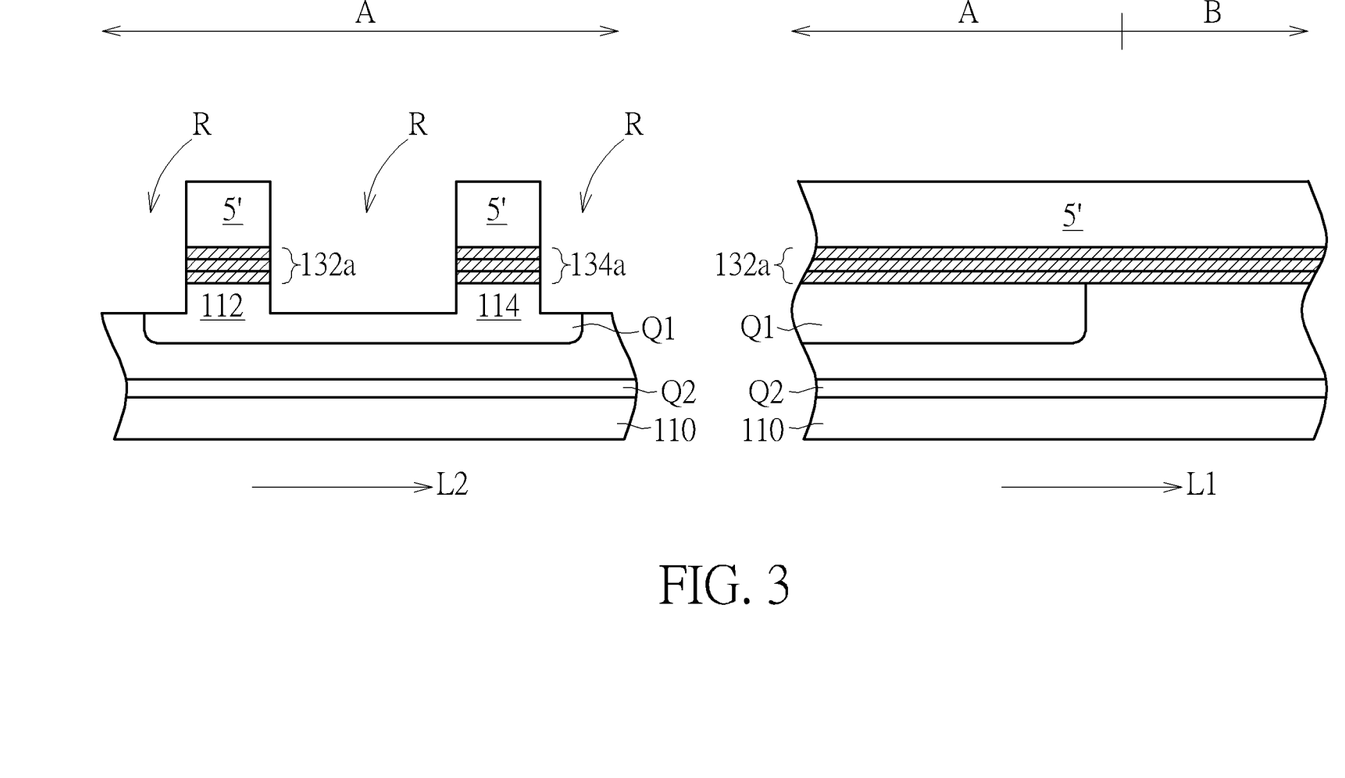

Thereafter, the hard mask 5, the oxide/nitride/oxide layer 130 and the substrate 110 are patterned, thereby the hard mask 5', the two oxide/nitride/oxide layers 132a/134a and the active areas 112/114 being formed, and trenches R being formed in the hard mask 5', the oxide/nitride/oxide layers 132a/134a and the substrate 110 along the first direction L1, as shown in FIG. 3.

Figure 4:
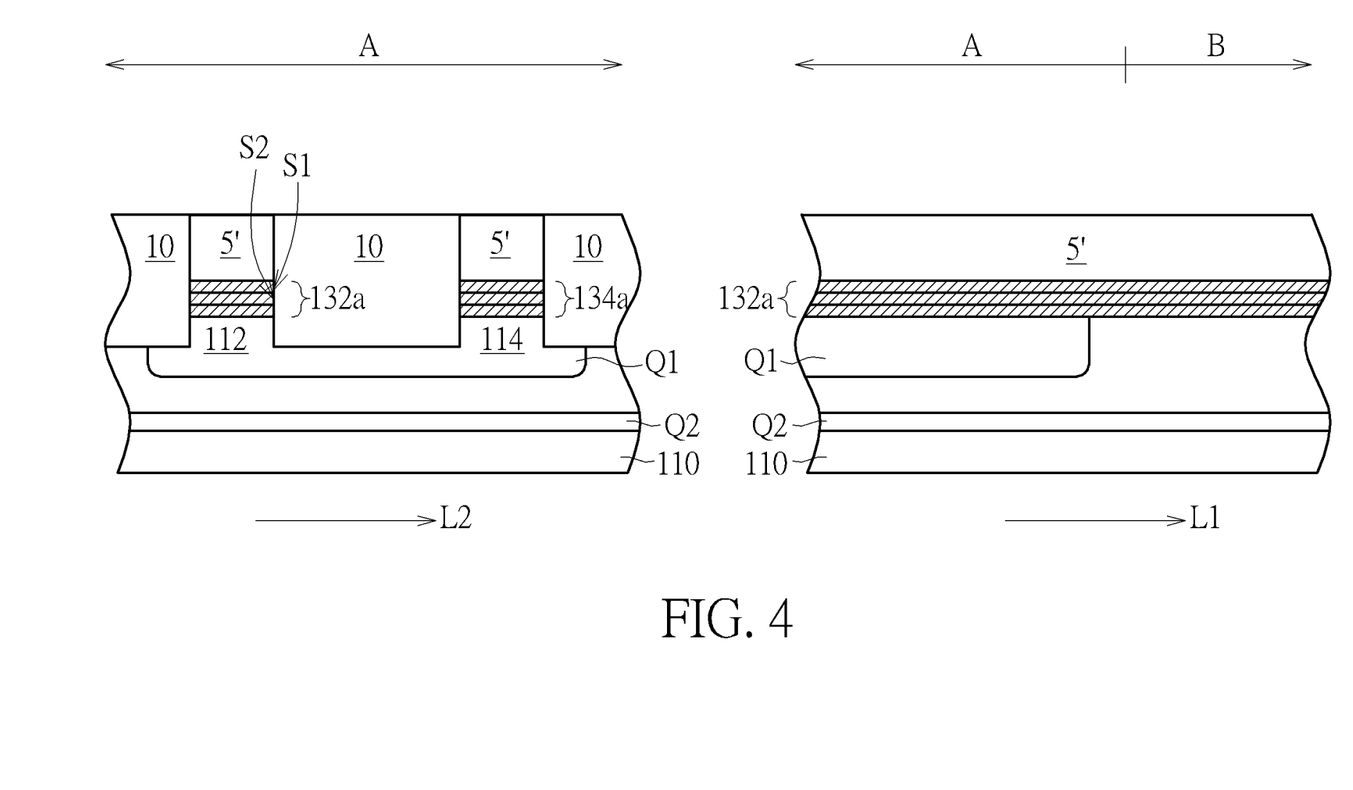

As shown in FIG. 4, the isolation structures 10 are formed in the trenches R beside the active areas 112/114 to isolate them.

Accordingly, by patterning the oxide/nitride/oxide layer 130 to define the trenches R for the isolation structures 10 formed therein, sidewalls S1 of the oxide/nitride/oxide layers 132a/134a can be trimmed with sidewalls S2 of the isolation structures 10 without misalignment occurring.

Figure 5:
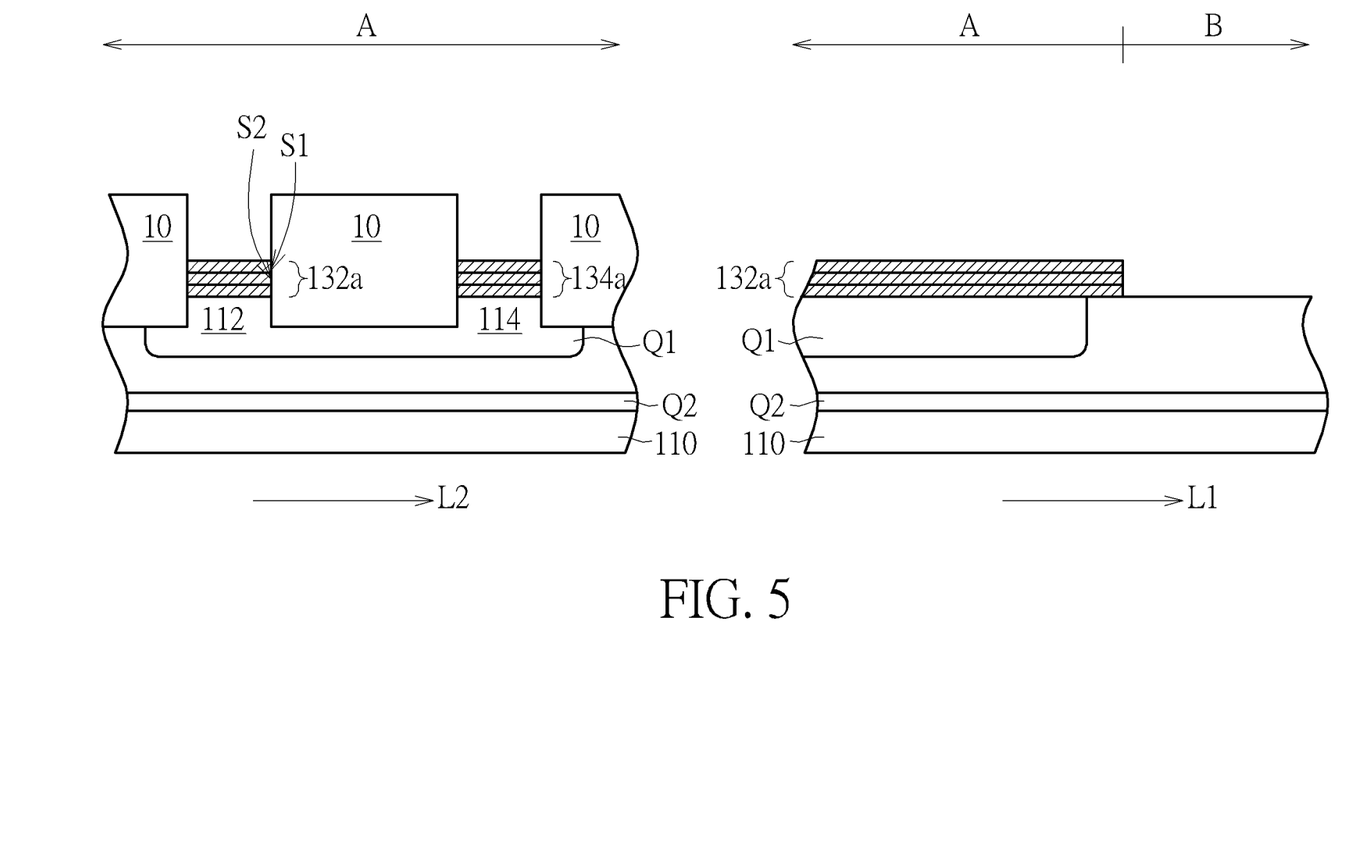

Then, the hard mask 5' is removed by methods such as an etching process containing hot phosphoric acid for removing nitride or dilute hydrofluoric acid (DHF) for removing oxide, as shown in FIG. 5. The oxide/nitride/oxide layers 132a/134a on the substrate 110 of the logic area B may then be removed while the oxide/nitride/oxide layers 132a/134a on the substrate 110 of the flash cell area A must be reserved. This means the oxide/nitride/oxide layers 132a/134a of the flash cell area A may be covered to expose the oxide/nitride/oxide layers 132a/134a of the logic area B while removing the oxide/nitride/oxide layers 132a/134a of the logic area B. This means the oxide/nitride/oxide layers 132a/134a are only formed in the flash cell area A, while the isolation structures 10 are formed in the flash cell area A and the logic area B.

Figure 6:
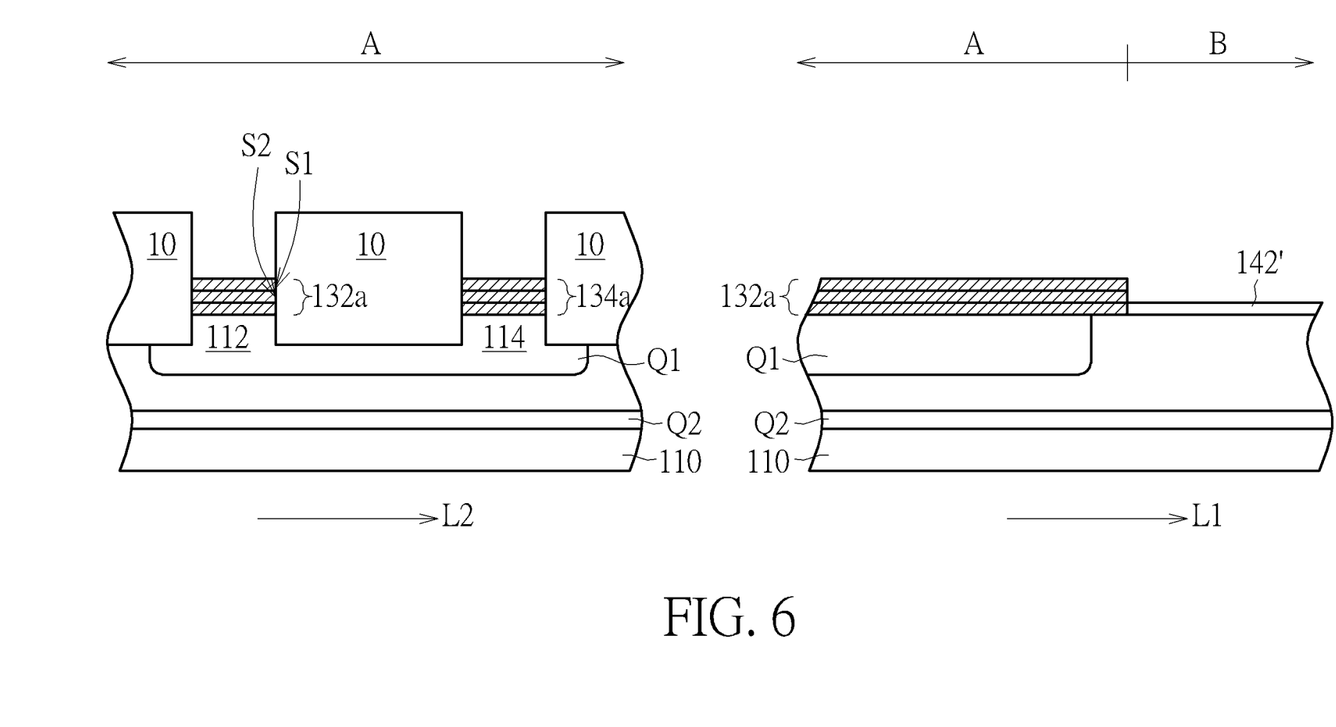
Figure 7:
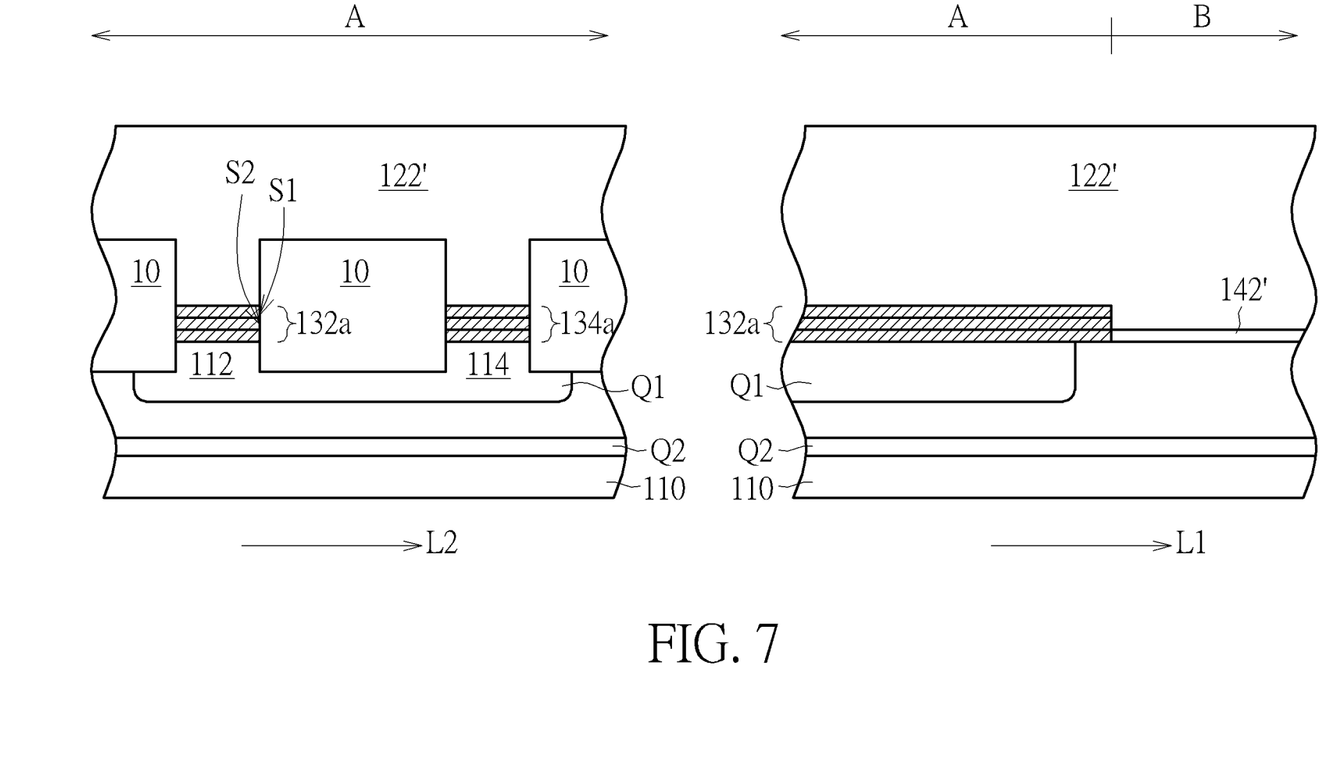
Figure 8:
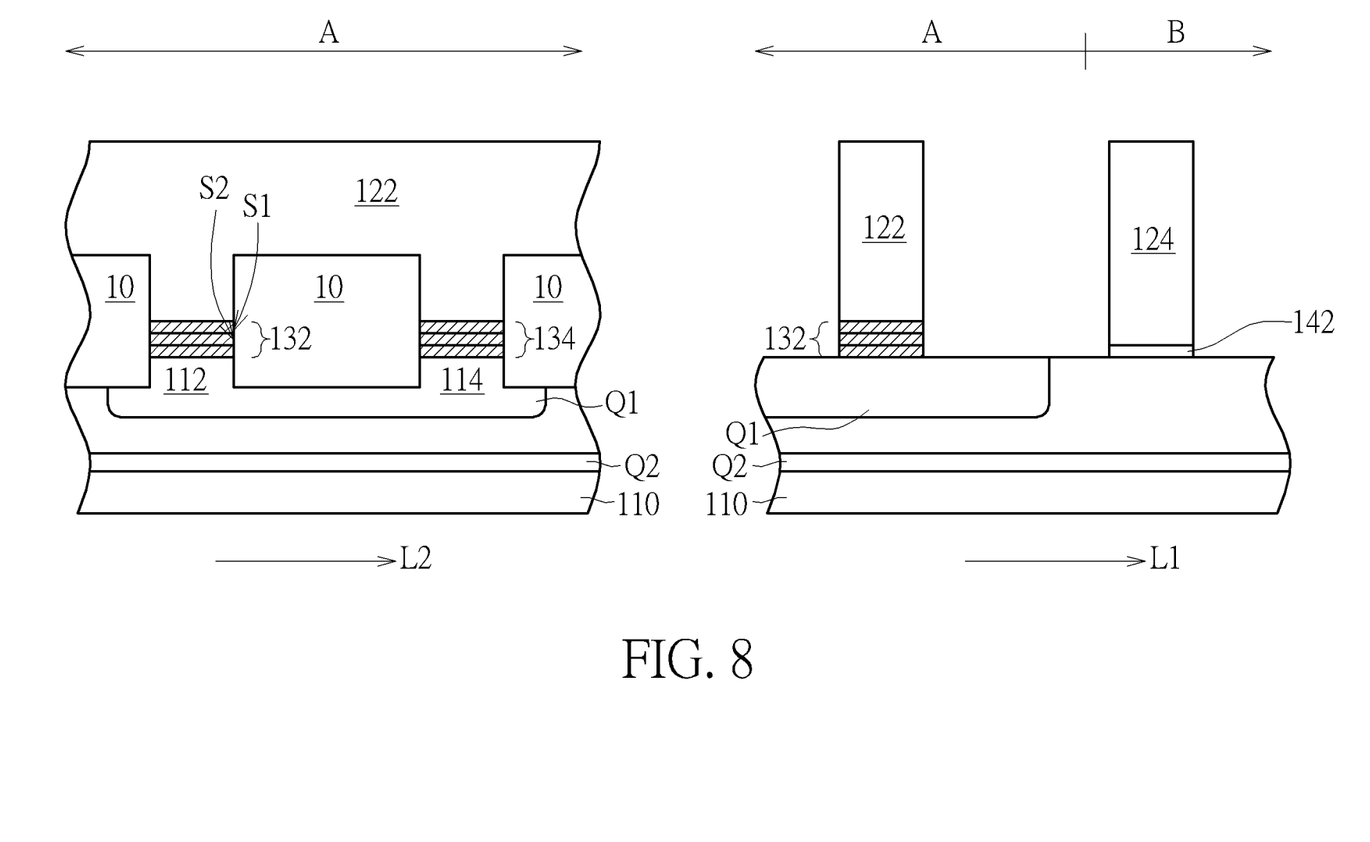

As shown in FIG. 6, the gate dielectric layer 142' may be formed only on the substrate 110 of the logic area B. In this embodiment, the gate dielectric layer 142' is formed by a thermal oxide process, so that the gate dielectric layer 142' is only formed on the substrate 110 of the logic area B, but it is not limited thereto. As shown in FIGS. 7-8, the first gate 122 and the oxide/nitride/oxide layers 132/134 are formed in the flash cell area A, while the second gate 124 and the gate dielectric layer 142 are formed in the logic area B. The first gate 122 is across the oxide/nitride/oxide layers 132/134 along the second direction L2 while the second gate 124 blanketly covers the gate dielectric layer 142 along the second direction L2. Therefore, the first gate 122 serving as a control gate is formed in the flash cell area A and the second gate 124 serving as a selective gate (or logic gate) is formed in the logic area B.

The method of forming the first gate 122, the oxide/nitride/oxide layers 132/134, the second gate 124 and the gate dielectric layer 142 may include, but not limited, to the following. As shown in FIG. 7, a first gate layer 122' may blanketly cover the oxide/nitride/oxide layers 132a/134a, the gate dielectric layer 142' and the substrate 110. Then, the first gate layer 122', the oxide/nitride/oxide layers 132a/134a and the gate dielectric layer 142' are patterned to form the first gate 122, the oxide/nitride/oxide layers 132/134, the second gate 124 and the gate dielectric layer 142 simultaneously, as shown in FIG. 8. The first gate layer 122', the oxide/nitride/oxide layers 132a/134a and the gate dielectric layer 142' may be patterned by one single process or sequential processes. It is emphasized that, the oxide/nitride/oxide layers 132/134 are thus only right below the first gate 122 and trimmed with the first gate 122 and the isolation structures 10. The oxide/nitride/oxide layers 132/134 may have square profiles in top view, but it is not limited thereto.

Figure 9:
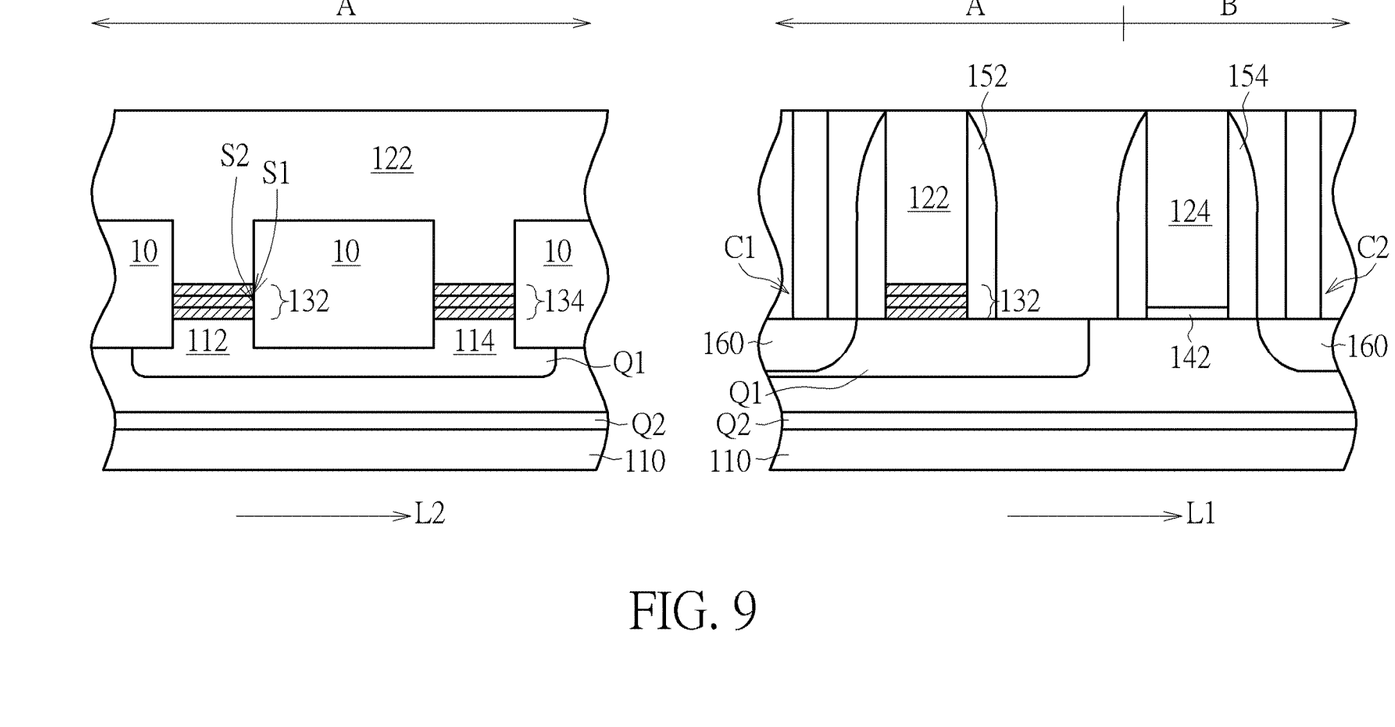

As shown in FIG. 9, spacers 152/154 may be formed on the substrate 110 beside the first gate 122 and the second gate 124 respectively. A source/drain 160 may then be formed in the substrate 110 at a side of the first gate 122 and a side of the second gate 124 opposite to the first gate 122. An interdielectric layer (not shown) may formed and planarized to form the interdielectric layer 150 covering the substrate 110 beside the first gate 122 and the second gate 124. The contact plugs C1/C2 may then be formed to penetrate the interdielectric layer 150 and directly contact the source/drain 160. The contact plugs C1/C2 may be formed by patterning the interdielectric layer 150 to have recesses and filling metals in the recesses, but it is not limited thereto.

To summarize, the present invention provides a trapping gate forming process and a flash cell, which forms an oxide/nitride/oxide layer on a substrate, patterns the oxide/nitride/oxide layer and the substrate to form at least an active area and at least a trench beside the active area along a first direction, forms an isolation structure in the trench, therefore the oxide/nitride/oxide layer can being defined on the active area and trimmed with the isolation structure. Thereafter, a first gate layer covers the oxide/nitride/oxide layer and the substrate, and then the first gate layer and the oxide/nitride/oxide layer are both patterned to form a first gate along a second direction orthogonal to the first direction and an oxide/nitride/oxide layer only right below the first gate and only in an overlapping area between the first gate and the active area. Thereby, the oxide/nitride/oxide layer is trimmed with the first gate along the second direction as well as the isolation structure along the first direction. In this way, due to the oxide/nitride/oxide layer only being in the overlapping area between the first gate and the active area, charge migration can be avoided during data retention, and loss of threshold voltage can be reduced. Besides, since the trench for the isolation structure formed therein is defined by patterning the oxide/nitride/oxide layer, the oxide/nitride/oxide layer can be trimmed with the isolation structure without misalignment occurring.

Moreover, the flash cell may include a flash gate formed by said method in a flash cell area and a selective gate in a logic cell area by forming the active area and the isolation structure not only in the flash cell area but also in the logic cell area, and a gate dielectric layer in the logic area is formed before the first gate layer covers the substrate of the flash cell area as well as the logic cell area. Then, the first gate layer is patterned to form the first gate and a second gate on the gate dielectric layer in the logic cell area at the same time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A trapping gate forming process, comprising:
    forming an oxide/nitride/oxide layer on a substrate, the substrate comprising a flash cell area and a logic area;
    forming a hard mask covering the oxide/nitride/oxide layer;
    patterning the hard mask, the oxide/nitride/oxide layer and the substrate to form at least a trench in the hard mask, the oxide/nitride/oxide layer along a first direction;
    forming an isolation structure in the trench;
    forming a first gate across the oxide/nitride/oxide layer along a second direction orthogonal to the first direction;
    before the first gate is formed, forming a gate dielectric layer only on the logic area of the substrate; and
    forming a second gate on the gate dielectric layer while the first gate on the oxide/nitride/oxide layer is being formed, so that a control gate is formed in the flash cell area while a selective gate is formed in the logic area.

2. The trapping gate forming process according to claim 1, wherein the hard mask comprises a nitride layer, an oxide/nitride layer, or an oxide/nitride/oxide layer.

3. The trapping gate forming process according to claim 1, wherein the hard mask comprises a single layer or a multilayer.

4. The trapping gate forming process according to claim 1, further comprising:
    removing the hard mask after the hard mask, the oxide/nitride/oxide layer and the substrate are patterned.

5. The trapping gate forming process according to claim 1, wherein the step of forming the first gate comprises:
    forming a first gate layer blanketly covering the oxide/nitride/oxide layer and the substrate; and
    patterning the first gate layer and the oxide/nitride/oxide layer to form the first gate and the oxide/nitride/oxide layer only being right below the first gate.

6. The trapping gate forming process according to claim 5, wherein the oxide/nitride/oxide layer is only formed in the flash cell area, while the isolation structure is formed in the flash cell area and the logic area.

7. The trapping gate forming process according to claim 1, further comprising:
    forming a flash cell implantation region in the substrate before the oxide/nitride/oxide layer is formed.

8. A flash cell, comprising:
    a substrate containing at least an active area extending along a first direction;
    a first gate being one single material layer disposed across the active area along a second direction orthogonal to the first direction, thereby intersecting an overlapping area; and
    an oxide/nitride/oxide layer disposed only in the overlapping area between the first gate and the active area, wherein the oxide/nitride/oxide layer is directly on and contacts the active area, and the oxide/nitride/oxide layer directly contacts the first gate having a non-planar bottom surface comprising a downward protruding part contacting the oxide/nitride/oxide layer.

9. The flash cell according to claim 8, further comprising: isolation structures disposed beside the active area.

10. The flash cell according to claim 9, wherein the substrate contains several active areas, wherein the isolation structures are disposed between the active areas to isolate them.

11. The flash cell according to claim 9, wherein the isolation structures are shallow trench isolation structures.

12. The flash cell according to claim 8, wherein the active area comprises a flash cell area and a logic area, wherein the first gate is disposed only in the flash cell area.

13. The flash cell according to claim 8, further comprising:
a second gate disposed across the active area in the logic area along the second direction.

14. The flash cell according to claim 13, further comprising:
a gate dielectric layer disposed between the second gate and the active area.

15. The flash cell according to claim 13, further comprising:
a source/drain beside the first gate and the second gate.

16. The flash cell according to claim 13, further comprising:
an interdielectric layer between the first gate and the second gate.

17. The flash cell according to claim 8, further comprising:
a third gate and a fourth gate disposed across the active area along the second direction, wherein the third gate and the fourth gate are symmetric to the first gate and the second gate respectively from a symmetric line between the third gate and the first gate along the second direction.

18. The flash cell according to claim 17, further comprising:
an oxide/nitride/oxide layer disposed on an overlapping area between the third gate and the active area.

19. The flash cell according to claim 17, further comprising:
a gate dielectric layer disposed between the fourth gate and the active area.

* * * * *